United States Patent [19]

Manassen et al.

[11] 4,368,216
[45] * Jan. 11, 1983

[54] PROCESS FOR PREPARATION OF SEMICONDUCTOR AND SEMICONDUCTOR PHOTOELECTRODE

[75] Inventors: Joost Manassen; David Cahen; Gary Hodes, all of Rehovot, Israel

[73] Assignee: Yeda Research and Development Co. Ltd., Rehovot, Israel

[*] Notice: The portion of the term of this patent subsequent to Oct. 20, 1998, has been disclaimed.

[21] Appl. No.: 173,814

[22] Filed: Jul. 30, 1980

Related U.S. Application Data

[63] Continuation-in-part of Ser. No. 134,665, Mar. 27, 1980, Pat. No. 4,296,188.

[30] Foreign Application Priority Data

Aug. 8, 1979 [IL] Israel ......................................... 58003

[51] Int. Cl.³ ........................... B05D 3/02; H01M 6/36
[52] U.S. Cl. ......................................... 427/74; 427/76; 429/111
[58] Field of Search ..................... 427/74, 76; 429/111

[56] References Cited

U.S. PATENT DOCUMENTS 2,999,240 9/1961 Nicoll .
3,486,059 12/1969 Kiuchi et al. .
3,598,643 10/1971 Hodes et al. .
4,064,326 12/1977 Manassen et al. .

OTHER PUBLICATIONS

"Printable Insulated-Gate Field-Effect Transistors", Y. T. Sihvonen et al., *J. Electrochem Soc.* 114, 96, (1967).
"Photovoltaic Junctions Formed on Silk-Screened Cadmium-Sulfide Layers", Vogdani et al., *Electronics Letters*, Mar. 22, 1973, vol. 9, No. 6.
"Photoelectrochemical Cells Based on CdS Polycrystalline Layers Sprayed on Conductive Glass", Proceedings of the International Conference Held at Luxembourg, Photovoltaic Solar Energy Conference, D. Reidel Publishing Co., 1977.

*Primary Examiner*—James R. Hoffman
*Attorney, Agent, or Firm*—Sandler & Greenblum

[57] ABSTRACT

Process for forming a semiconductor finding use in solid state and PEC cells as a photoelectrode, comprising preparing a slurry of at least one semiconductor starting material used to form the semiconductor, a flux and a liquid vehicle; applying a layer of the slurry to an electrically conductive substrate; and annealing the layer. The semiconductor produced by the process and a photoelectrochemical cell including the semiconductor.

26 Claims, 3 Drawing Figures

PROCESS FOR PREPARATION OF SEMICONDUCTOR AND SEMICONDUCTOR PHOTOELECTRODE

CROSS-REFERENCE TO COPENDING APPLICATION

This application is a Continuation-in-Part of U.S. patent application Ser. No. 134,665 filed Mar. 27, 1980, now U.S. Pat. No. 4,296,188, the disclosure of which is hereby incorporated by reference thereto.

BACKGROUND OF THE INVENTION

1. Field of the Invention

The invention relates to a novel process for the production of a semiconductor or a semiconductor-containing layer which may be used in semiconductor-containing devices such as solar cells and particularly photoelectrochemical cells.

2. Description of Prior Art

U.S. Pat. No. 4,064,326 discloses a photoelectrochemical cell (PEC) device for directly converting radiant energy into electrical energy. FIG. 1 schematically illustrates a PEC having a photoelectrode 11, counterelectrode 13 and electrolyte 15, all contained within container 17. A load 19 is connected across the photoelectrode and counterelectrode. We have developed significant improvements of several components of such devices, e.g., the counterelectrode (see U.S. Patent Application Ser. No. 118,761, now abandoned), as well as improving cell construction and cell interconnections.

The photoelectrode is the key element of the phtoelectrochemical cell and is usually the most expensive part of the cell as it must often be monocrystalline. U.S. Pat. No. 4,064,326 discloses techniques for inexpensively preparing the photoelectrode, such as by electroplating, spraying, or sublimation.

Although such methods are satisfactory for certain semiconductor materials, other semiconductors do not lend themselves well to such methods of preparation and more expensive methods, such as sputtering or vacuum evaporation, may therefore become necessary.

Methods whereby a semiconductor paste is applied to a substrate and sintered, typified on the large scale by silk-screen printing, are well known for printing passive circuit components, in particular, the use of Cd(S,Se) and their mixtures as photoresistors. In 1967, Sihvonen et al. used printed CdS,Se for producing field effect transistors (PET's) and claimed that this was the first use of such a method for preparing other than passive components (J.Electrochem. Soc. 114, 96 (1967)).

Of greater interest is the use of silk-screened CdS for the preparation of solid state CdS-$Cu_2$S photovoltaic cells, described by Vojdani et al, (Electron Lett., 9, 128 (1973)). The results obtained were poor, due mainly to a high series resistance of the cells.

Until this time, no generally applicable, versatile method for the preparation of thin film photoelectrodes, which is both cheap and simple, has been described.

SUMMARY OF THE INVENTION

It is, therefore, an object of the invention to provide a generally applicable technique for the production of semiconductors and semiconductor layers, which semiconductors find particular use in solid state and in particular in PEC solar cells.

It is a further object of the invention to provide a process particularly suitable for the production of PEC electrodes.

The invention provides a general, versatile, inexpensive and simple technique for preparing thin film electrodes, and is particularly suited for forming photoelectrodes used in photoelectrochemical cells. However, the applicability of the inventive technique is not limited to PEC's, and is applicable to a much broader variety of semiconductors and fluxing agents than has been previously described for similar methods.

The invention is particularly suited to the production of photoelectrodes since in a PEC, the photoactive semiconducting layer is required to perform quite differently from the semiconductor used in a solid-state junction solar cell. For example, the degree of crystallinity of the semiconducting layer is less critical in a PEC than in a solid state junction device, and increased polycrystallinity may even exert a beneficial effect on PEC stability.

According to a preferred embodiment of the invention, a photoelectrode of a given composition is prepared from at least one semiconductor starting material. The starting material may be either single or multiple-phase. When referring to "single phase" starting materials, solid solutions and the like are intended while "multi-phase" starting materials may be in the form of non-homogeneous particles. In order to prepare a thin film photoelectrode from such a semiconductor, the semiconductor is mixed with a suitable flux and the resulting mixture is dispersed in a suitable liquid phase to form a slurry. While the semiconductor starting material and flux may be added to the liquid vehicle after first having been mixed themselves, the order of mixing is not critical. The resulting slurry is then applied to a suitably treated electrically conducting substrate and annealed under suitable conditions of temperature and atmosphere. The resulting photoelectrode may be used, as is, or be further treated to improve its performance when the electrode is subsequently inserted within a cell such as a PEC or a solid state cell.

As used herein the term "annealed" is not used in the conventional metallurgical sense, but, instead, is intended to connote the treatment of the applied layer under conditions of temperature and pressure resulting in at least the partial dissolution of at least one semiconductor material in the flux material prior to removal of the flux so as to result in a structurally integral stable layer. Generally, this means heating the layer to at least near the melting point of the flux so as to allow for at least partial dissolution. Quite obviously, higher temperatures above the melting point may be used.

Semiconductor materials may be used to "tailor" the photoactive spectral region of the photoelectrode; a feature of great value for producing mixtures of chalcogenide (O, S, Se, Te) semiconductors.

As used throughout the specification, the term "semiconductor" is meant to include semiconductor components which comprise a semiconductor layer mounted on a conductive substrate.

According to another aspect of the invention, a process is provided wherein a semiconductor is formed by preparing a slurry of at least one semiconductor starting material, a flux and a liquid vehicle. A layer of the slurry is applied to an electrically conductive substrate and the layer is than annealed.

DESCRIPTION OF PREFERRED EMBODIMENTS

Figure 1:
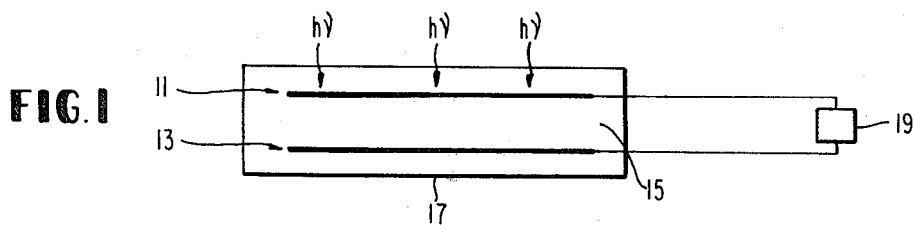
FIG. 1 is a schematic drawing of a photoelectrochemical cell (without storage means)

According to a basic embodiment of the instant invention, photoelectrodes may be prepared using commercially available semiconductors of the desired composition. Table I shows some non-restrictive examples of such semiconductors, and some of the possible electrolytes in which they may be used.

TABLE I

| Semiconductor | Electrolyte |
|---|---|
| CdSe | $S_x^{2-}$ |
| CdTe | $Te_x^{2-}$, $S_x^{2-}$ |
| GaAs | $Se_x^{2-}$, $I_x^-$ |
| MoSe$_2$ | $I_x^-$ |
| CuInS$_2$ | $S_x^{2-}$ |
| ZnSe | $S_x^{2-}$ |
| GaP | $Se_x^{2-}$ |
| WSe$_2$ | $Fe^{2+/3+}$ |

The semiconductor material(s) used to form the slurry is (are) preferably in the powdered state prior to admixture with the flux and liquid vehicle. As noted previously, it is one advantage of the invention that use of a wide variety of fluxes is possible, thus not limiting the invention to CdS, CdSe, and mixtures and alloys thereof. Such fluxes may include indium halides, aluminium halides, gallium halides or mixtures thereof.

Photoelectrodes of most compositions, such as binary, ternary, quaternary or higher multi-element compounds, solid solutions or physical mixtures, may be prepared using powders which comprise the parent or constituent semiconductor materials in the correct proportions and compositions.

Physical mixtures of the powders can be prepared by simple mixing of different single or multi-component semiconductor starting materials.

Solid solutions or semiconductor materials may be formed by hot pressing, or heating (annealing) the starting materials with a suitable flux; the pressed or sintered products being then reduced to a powder. The flux used in the course of the heating of the starting materials prior to grinding may be the same or different from the flux added to the slurry prior to application of the layer. The ground powders thus formed are then formed into a slurry together with the flux, applied and then annealed. The flux used to form the ground powder once again serves to effect at least partial dissolution of the starting materials in the flux as they are heated. The flux once again may vaporize away during heating. Table II shows some non-restrictive examples of such mixtures, and the method of their preparation.

TABLE II

| Parent materials | Final mixture | Method of preparation |
|---|---|---|
| CdSe, CdTe | CdSe$_{0.55}$ Te$_{0.45}$ | Flux, Sintering |
| CdS, CdSe | CdS$_{0.9}$ Se$_{0.1}$ | Flux, Sintering |
| CdS, CdTe, ZnSe | (Cd$_{1-x}$Zn$_x$) (S,Se,Te) | Hot pressing |
| AlAs, GaAs | GaAlAs | Flux, sintering |
| Cu$_2$S, In$_2$S$_3$ | CuInS$_2$ | Hot pressing |
| Cr, CdSe | Cr + CdSe* | Simple mixing |

*Isolated Cr metal particles in CdSe matrix.

Beginning with a final mixture of the semiconductor materials used to form the device, the semiconductor material is first reduced to a powder, if not already in powdered form, of a suitable particle size. Fine powders, of about 2-30 micron size, are preferred since they can be more easily slurried in a suitable liquid vehicle, although other sizes may be used.

The process for the production of semiconductor and/or semiconductor-containing layers, and particularly for the production of photoelectrodes is basically as follows:

The powder is mixed intimately with a suitable flux material. The requirements of such a flux are that it melts during annealing when heated with the semiconductor powder to a temperature at least near its melting point, and that it effects at least partial dissolution of the powder semiconductor in the flux. The flux itself may be in powdered form and should preferably volatize during the annealing step, although any remaining flux may also be subsequently dissolved away from the semiconductor. Such fluxes, which are suitable for many different semiconductors, include Cd and Zn halides, i.e., fluorides, bromides, chlorides and iodides. Other fluxes such as mercury halides may likewise be used. Fluxes may be used singly or in combination. Additionally, according to one embodiment of the invention, the flux may also serve to dope the semiconductor, such as when In, Ga or Al halides, are incorporated in the flux. As an example, an InCl$_3$ containing flux can be used for the preparation of n-type CdTe layers. While fluxes consisting of only dopant materials may be used, such are not preferred since the resulting semiconductor may be too highly doped.

The addition of small quantities of less-readily volatilizable materials can also advantageously be used, e.g. the addition of CdSO$_4$ or ZnSO$_4$ to the semiconductor and flux.

A liquid vehicle is added to the semiconductor powder to form a slurry. The liquid may be water or an organic solvent which results in a mixture having a suitable viscosity so as to result in a smooth slurry of the powder and flux, suitable for application to the photoelectrode substrate by rolling, brushing (painting) and the like. If water is used for dispersing the powder it may be advantageous to add a suitable surface active agent so as to ensure homogeneous wetting and a slurry having good dispersion. The boiling point of the liquid vehicle should be low, so as to ensure its total evaporation during the annealing process, but not so low that the slurry dries up during its application to the substrate. Furthermore, the liquid should boil homogeneously so that no trace of it is left in the annealed mass.

The slurry is then applied as a thin layer to a suitable electrically conductive substrate. The substrate must preferably be chemically inert, and relatively electrochemically inert to the solution in which the photoelectrode will be used. The electrode substrate must be conductive and can be prepared from most metals or alloys by covering the metal or alloy with a thin layer of an appropriate corrosion resistant or inert metal or alloy prior to application of the slurry. Quite obviously, in non-corrosive systems a coating is unnecessary. For example, Cr-plated steel substrates are very suitable for use in polysulfide solutions. Quite obviously, if the semiconductor layer will not be used in an electrolyte containing PEC but in a solid state device, the above restrictions relative to the electrolyte do not apply.

Prior to applying the slurry to a metal substrate, the substrate is heated in an $O_2$-containing atmosphere to form a thin oxide layer, typically on the order of about 0.1–0.3 microns thereby giving a characteristic yellowish or purple coloration to the metal.

A variety of electrically conducting materials is available for use as substrates for the semiconductive layer, can be effected advantageously by dipping the electrode in a solution containing the "etchant". For example, solutions of $Zn^{+2}$, $Cr^{+6}$ and $Ce^{+4}$ ions, their complex ions, or a combination of any of these metal ions and/or their complex ions, are suitable for etching certain Cd and Zn chalcogenides. The ion etchings may be performed with or without a previous acid etch.

Figure 2:
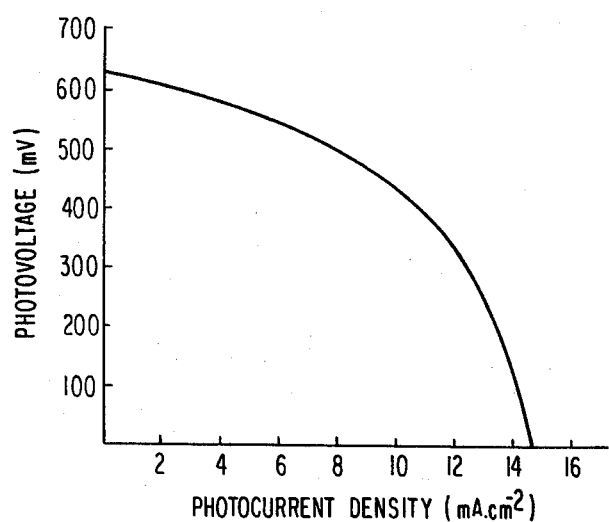
FIG. 2 is a plot of photocurrent density vs. photovoltage of a 0.22 cm$^2$ CdSe$_{0.65}$ Te$_{0.35}$ photoelectrode in a solution of 1 M each KOH, Na$_2$S.9H$_2$O and S under illumination equivalent to 0.85×AM1.
Figure 3:
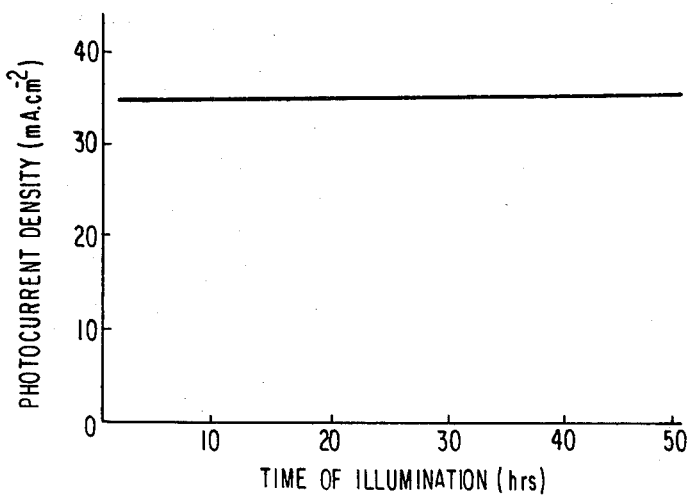
FIG. 3 is a plot of the photocurrent of a CdSe$_{0.65}$ Te$_{0.35}$ photoelectrode in a solution 1 M each in KOH, Na$_2$S.9H$_2$O and S, under illumination of ~2.5×AM1 and under short circuit conditions, as a function of time of illumination.

FIGS. 2 and 3 illustrate the characteristics of a 0.22 $cm^2$ $CdSe_{0.65}Te_{0.35}$ photoelectrode when used in a PEC such as shown in FIG. 1 with a 1 M each KOH, $Na_2S.9-H_2O$ and S electrolyte solution under illumination equivalent to $0.85 \times AM1$.

Table III illustrates some non-restrictive examples of the preparation process of semiconductive layers by the inventive technique. The ion etchings may be performed with or without a previous acid etch.

TABLE III

| Compound | Flux (for mixed powders) | Flux (for paint) | Post-treatment | Specific ion "etch" | Electrolyte $KOH/Na_2S/S$ $(M)^2$ | Light intensity $\times$ AMI | mV (OCV) | PERFORMANCE $\Omega$/mV max-power | mA (SCC) |
|---|---|---|---|---|---|---|---|---|---|
| CdS (BDH reagent grade) | — | $CdCl_2$ | — | $ZnCl_2$ | 1/1/0.1 | 1 | 500 | 230/370 | 2.5 |
| ZnSe | — | $ZnBr_2/CdSO_4$ | — | $ZnCl_2$ | 1/2/0.1 | U.V. | 650 | — | 2.0 |
| $CdS_{0.9}Se_{0.1}$ | $CdCl_2$ | $CdCl_2$ | — | $ZnCl_2$ | 1/2/0.1 | U.V. | 850 | 30/555 | 32.5 |
| $CdTe_{0.6}S_{0.4}$ | $CdCl_2$ | $CdCl_2/CdSO_4$ | — | None | 1/1/1 | 0.90 | 502 | 100/386 | 5.8 |
| $CdSe_{0.65}Te_{0.25}S_{0.1}$ | $CdCl_2$ | $CdCl_2$ | — | None | 1/1/1 | 0.82 | 585 | 60/409 | 10.2 |
| $CdSe_{0.74}Te_{0.26}$ | $CdCl_2$ | $CdCl_2/CdSO_4$ | — | None | 1/1/1 | 0.84 | 645 | 60/454 | 11.0 |
| $CdSe_{0.65}Te_{0.35}$ | $CdCl_2$ | $CdCl_2/CdSO_4$ | — | None | 1/1/1 | 0.82 | 610 | 55/446 | 12.0 |
| $CdSe_{0.55}Te_{0.45}$ | $CdI_2$ | $CdCl_2/CdSO_4$ | — | None | 1/1/1 (+1mM Se) | 0.80 | 520 | 40/340 | 14.0 |
| $CdTe_{0.75}Se_{0.25}$ | $CdCl_2$ | $CdCl_2/CdSO_4$ | $H_2/250°$ C./5 min | None | 1/1/1 | 0.82 | 407 | — | 15.0 |
| CdTe | — | $CdCl_2$ | $H_2/290°$ C./5 min | None | 1/1/1 | 0.83 | 570 | — | 10.2 |
| CdTe (0.3% $In_2S_3$) | $CdCl_2$ | $InCl_3/CdCl_2$ | — | None | 1/1/1 | 0.83 | 441 | 50/259 | 7.0 |
| CdTe | — | $CdCl_2$ | 1 min 300° in air | None | (3/0.1/0.1) $OH^-/Te^{2-}/Te$ | ~0.90 | 30 | (p-type) | 0.7 |
| ZnTe | — | $ZnCl_2$ | — | None | (3/0.1/0.1) $OH^-/Te^{2-}/Te$ | ~0.90 | 35 | (p-type) | 0.6 |
| $CuInS_2$* (Cd annealed) | — | $InCl_3$ | 5 min $H_2$ @ 240° C. | | 1/2/1 | 0.83 | 100 mV | — | 1.1 |
| GaAs | — | $CdI_2$ | Heat at 450° C. for 10 min in air (no previous anneal) | — | 2M KI 0.1M I | 0.82 | 130 | (n-type) | 0.2 |
| $MoS_2$ | — | $CdI_2$ | as for GaAs | None | as for GaAs | 0.93 | 75 | (n-type) | 0.05 |
| $CdSe_{0.5}Te_{0.5}$ | $CdCl_2$ | $CdCl_2$ | — | $K_2CrO_4$ | 1/1/1 | 0.79 | 642 | 50/429 (0.93 $cm^2$) | 12.4 |

All electrodes of area 1 $cm^2$ except last example (0.93 $cm^2$) on $Ti/TiO_2$ substrate annealed for 8–12 mins. at 625–650° C. (except GaAs and $MoS_2$).
*=Annealed in an atmosphere of Cd vapor.

and the final choice will be a function of cost, chemical and electrochemical inertness, adhesion of the layer to the substrate, and the like, as well as the intended use of the layer.

The applied semiconductor layer is then annealed in an inert atmosphere by heating the layer to at least near the melting point of the flux, so as to effect at least partial dissolution in the flux. It is possible also, and at times even preferred to add an oxidizing or reducing component to the annealing atmosphere so as to control the electrical properties (electrical conductivity and type) of the semiconductor. Annealing temperatures between 600° and 700° C. degrees are commonly used, and annealing times of 5 to 20 minutes will be sufficient for most materials. For each slurry specific optimal conditions in this range can be determined.

After cooling the annealed electrode is ready for use. However, in many cases at least one specific additional treatment may be beneficial for photovoltaic performance. Such treatments include not only normal etchings (e.g. acid etch), well known in the semiconductor field, but also specific ion "etchings". Such "etching"

Table IV gives some non-restrictive examples of substrates on which the slurry may be applied and the layers applied together with the results achieved.

TABLE IV

| Substrate | Semiconducting layer | Output parameters (1 $cm^2$ electrode under AMI conditions) | |
|---|---|---|---|
| | | Short circuit current (mA) | Open circuit voltage (mV) |
| Ti | $CdSe_{0.5}Te_{0.5}$ | 16.9 | 642 |
| Cr-plated steel | $CdSe_{0.65}Te_{0.35}$ | 10.2 | 570 |
| Graphite | $CdSe_{0.65}Te_{0.35}$ | 8.1 | 480 |
| conducting glass | CdSe (annealed at 500° C. for 12 min.). | 3.1 | 430 |

EXAMPLES

Example 1

CdSe powder of 99.999% purity (3 micron average particle size) is mixed with $ZnCl_2$ powder (flux) of reagent grade in a weight ratio of 25:2. This mixture is ground together with a mixture of 5% nonionic detergent in water (v/v) to give a smooth paint. For each 50 mg. of powder (0.05 ml of the detergent containing water is used. This paint is applied to a piece of titanium metal, 0.6 mm thick, 3.5 cm² area, using a fine paint brush. Only the amount of paint needed to coat this area once is used. The titanium metal is preheated at 650 degrees C. for 40 seconds in an atmosphere of inert gas (argon), containing 20 ppm of $O_2$, which has been previously passed over a water-soaked glass wool plug prior to entering the heating zone. The heated treated Ti exhibits a yellow to purple coloration. The coated substrate is dried at room temperature and is then heated under the same conditions of temperature and atmosphere as used for the Ti substrate, for a period of 12 minutes. The coated substrate is cooled slowly (during 5 minutes) to room temperature, in the same atomosphere. The annealed, coated substrate is then used as a photoelectrode in a PEC, further comprising a sulfided brass gauze counterelectrode (see U.S. Patent Application Ser. No. 118,761) and an aqueous solution 1 M in each of KOH, $Na_2S.9H_2O$ and S. This PEC gives, under simulated AM1 conditions a short circuit current of 26.2 mA, an open circuit voltage of 530 mV and a photopotential of 388 mV over an optimal load of 24 ohms, thus yielding a maximal power ourput of 6.3 mW (1.8% radiant energy conversion efficiency). The CdSe photoelectrode is etched for 5 seconds in 3% $HNO_3$ in conc. HCl (v/v). After this treatment the same PEC containing the etched photoelectrode yields, a short circuit current of 36.5 mA, an open circuit voltage of 605 mV, and a photopotential of 424 mV over an optimal load of 17 ohms. This corresponds to an optimal power output of 10.6 mW (3% conversion efficiency). The photoelectrode is dipped for 3 seconds in a 1 M aqueous $ZnCl_2$ solution and subsequently rinsed with 0.06 ml $H_2O$ and blotted dry. This photoelectrode in the same PEC now yields a short circuit current of 36.8 mA, an open circuit voltage of 660 mV and a photopotential of 463 mV over an optimal load of 18 ohms. This corresponds to an optimal power output of 11.9 mW (3.4% conversion efficiency).

Example 2

A 1 cm² electrode is prepared as in Example 1, using reagent grade CdS and $CdCl_2.2.5H_2O$ as starting materials which form the starting powder in a weight ratio of 50:3. This electrode, after etching in 50:50 $HCl:H_2O$ (v/v) for 5 seconds and a $ZnCl_2$ treatment as in Example 1, when used in a PEC as in Example 1, but with 0.1 M S instead of 1 M, gives a short circuit current of 2.5 mA, an open circuit voltage of 500 mV and a photopotential of 370 mV over an optimal load of 230 ohms, yielding an optimal power of 0.6 mW (0.6% conversion efficiency) under simulated AM1 conditions.

Example 3 A powder of nominal composition $CdSe_{0.50}Te_{0.50}$ is prepared as follows: 99.999% CdSe (3 micron) and 99.99% CdTe (~10 micron) are mixed in 1:1 molar ratio with 25% (by weight) $CdCl_2.2.5H_2O$. This mixture is ground with 2 drops of ethanol per 100 mg mixture. The mixture is allowed to dry at room temperature and the dry powder is fired at 660 degrees C. for 40 minutes in an atmosphere containing 10 ppm of oxygen in argon, and cooled subsequently in the same atmosphere. This material is used as the starting powder (after light grinding) to prepare a 0.93 cm² photoelectrode as in Example 2. When incorporated in a PEC as in Example 1, under 0.79 AM1 illumination and etched as in Example 1, the PEC gives a 12.6 mA short circuit current, 582 mV open circuit voltage, and a 400 mV photopotential over an optimal load of 50 ohms yielding 3.2 mW (4.35% conversion efficiency). After treating this electrode with 2 M aqueous $K_2CrO_4$ solution, by dipping for 3 seconds and patting the electrode dry, the PEC gives a 12.4 mA short circuit current, 642 mV open circuit voltage and 429 mV photopotential at 50 ohms (5% conversion efficiency).

Example 4

An electrode is prepared as in Example 3, but on a different substrate and by using a 65:35 molar ratio mixture of CdSe and CdTe on Cr-plated steel. This substrate is pretreated by plating mechanically cleaned steel in a solution of 3 M $CrO_3$ and 0.026 M $H_2SO_4$ in $H_2O$, using a Pt anode and a current density of 200 mA/cm² for 10 minutes, at room temperature. This gives a somewhat roughened surface. This substrate is heated under the same conditions as used for Ti in Example 1, but for 3 minutes. The 1 cm² electrode, when used in a PEC as in Example 1, gives an 8.5 mA short circuit current, a 570 mV open circuit voltage and a 385 mV photopotential over an optimal load of 70 ohms, yielding 2.1 mW under 0.82 AM1 simulated conditions (~2.6% conversion efficiency).

Example 5

$CuInS_2$ is prepared from elemental Cu, In and S by heating stoichiometric quantities in an evacuated silica tube at 1150 degrees C. for 24 hours. The product is ground and the resultant powder is used to prepare a 1 cm² electrode as in Example 1, but wherein $InCl_3$ replaces the $ZnCl_2$. The annealed electrode is treated for 5 minutes in an atmosphere of 1:2 $H_2$:Ar at 240 degrees C. This electrode is etched in 3% $HNO_3$ in HCl for 5 seconds and rinsed. This electrode is used in a PEC as in Example 1, containing 2 M $Na_2S.9H_2O$ instead of 1 M. The PEC gives a 1.1 mA short circuit current, a 100 mV open circuit voltage at 0.83 AM1 simulated sunlight.

Example 6

An electrode is prepared as in Example 1. The paint slurry is formed in this case by mixing 1 drop of ethylcellulose in toluene (saturated solution) and 5 drops of ethylene glycol monobutylether with 90 mg CdSe, and 5 mg $CdCl_2.2.5H_2O$. The 1 cm² electrode when used in a PEC as in Example 1, using an electrolyte solution 2 M in KOH, $Na_2S.9H_2O$ and S, and after etching in $HCl/HNO_3$ and dipping in $ZnCl_2$ solution as in Example 1, yields 8 mA short circuit current, a 675 mV open circuit voltage and a 530 mV photopotential over an optimal load of 100 ohms, yielding a power output of 2.8 mW (2.9% conversion efficiency) under simulated 0.95 AM1 conditions.

Example 7

$Cd_{0.95}Zn_{0.05}Se$ powder is prepared by precipitation from a solution of $CdSO_4$ and $ZnSO_4$ in a 95:5 molar ratio by $H_2Se$. 50 mg of the dride powder is mixed with 5 mg $CdCl_2.2.5H_2O$ and 1 mg $CdSO_4$, and a paint is prepared from water and detergent as in Example 1. This paint is used to make an electrode as in Example 1, and the 1 $cm^2$ electrode gives, after etching and treatment with $ZnCl_2$ as in Example 1, a 7.4 mA short circuit current, a 650 mV open circuit voltage and a 480 mV photopotential over an optimal load of 100 ohms.

Although the invention has been described with reference to particular methods of preparing the starting powders, particular electrodes, and particular electrolytes, it is to be understood that the invention is not limited to the particulars disclosed but extends to all equivalents falling within the scope of the claims.

What is claimed is:

1. A process for forming an electrode for use in a solar cell comprising:
   (a) preparing a slurry of at least one semiconductor starting material used to form said semiconductor in powdered form, a flux and a liquid vehicle;
   (b) applying a layer of said slurry to an electrically conductive substrate;
   (c) annealing said layer to form said semiconductor electrode by treating said layer of step (b) under conditions of temperature and pressure so as to at least partially dissolve at least a portion of one semiconductor material in said flux; and
   (d) inserting said semiconductor photoelectrode in said cell.

2. The process as defined by claim 1 comprising annealing said layer at an elevated temperature under a suitable atmosphere.

3. The process as defined by claim 1 wherein said cell is a photoelectrochemical cell.

4. The process as defined by either of claims 1 or 3 comprising forming said semiconductor electrode to comprise binary, ternary, quaternary or higher multielement compounds.

5. The process as defined by claim 4 wherein said flux is in powder form together with said at least one semiconductor starting material.

6. The process as defined by claim 5 wherein said at least one semiconductor starting material is formed by pressing said semiconductor material and grinding said pressed semiconductor material to form a powder.

7. The process as defined by claim 5, wherein said semiconductor starting material is formed by mixing a semiconductor with a flux, annealing said mixture and grinding said annealed mixture.

8. The process as defined by either of claims 1 or 3 comprising heating said flux to at least near the melting point of said flux, said flux being adapted to volatilize wholly, or in part, during said annealing step.

9. The process as defined by claim 8 wherein said flux is selected from the group consisting of a cadmium halide, a zinc halide or mixtures thereof.

10. The process as defined by either of claims 1 or 3 further comprising treating the electrode of step (c) with a specific metal-ion etching.

11. The process as defined by claim 10 wherein said specific metal-ion etching comprises treating said electrode of step (c) with a metal ion selected from the group consisting of $Zn^{+2}$, $Cr^{+6}$ or $Ce^{+4}$, the complex ions of any of these ions, or a combination of any of these metal ions and/or their complex ions.

12. The process as defined by either of claims 1 or 3 wherein said flux is selected so as to dope said semiconductor.

13. The process as defined by claim 12 wherein said flux comprises a member selected from the group consisting of indium halide, aluminum halide, gallium halide or mixtures thereof.

14. The process as defined by claim 13 wherein said flux further comprises a member selected from the group consisting of cadmium halide, zinc halide, or mixtures thereof.

15. The process as defined by either of claims 1 or 3 wherein said liquid is water.

16. The process as defined by 15 wherein said water comprises a small quantity of a surface active agent.

17. The process as defined by either of claims 1 or 3 wherein said liquid is a non-aqueous liquid or a mixture of non-aqueous liquids.

18. The process as defined by either of claims 1 or 3 wherein said liquid comprises water in admixture with a non-aqueous liquid.

19. The process as defined by claim 3 wherein said at least one starting material is selected from the group consisting of $CdSe_{0.55}Te_{0.45}$, $CdS_{0.9}Se_{0.1}$, $(Cd_{1-x}Zn_x)(S,SeTe)$, GaAlAs, $CuInS_2$, and chromium metal particles in a CdSe matrix.

20. The process as defined by claim 3 wherein said at least one starting material is selected from the group consisting of CdS, ZnSe, $CdS_{0.9}Se_{0.1}$, $CdTe_{0.6}S_{0.43}$, $CdSe_{0.65}S_{0.1}Te_{0.25}$, $CdSe_{0.74}Te_{0.26}$, $CdSe_{0.65}Te_{0.35}$, $CdTe_{0.75}Se_{0.25}$, CdTe, $CdTe(0.3\% In_2S_9)$, $CuInS_2$, GaAs, $MoS_2$, and $CdSe_{0.5}Te_{0.5}$.

21. The process as defined by either of claims 19 or 20 wherein said flux is selected from the group consisting of $CdCl_2$, $ZnBr_2/CdSO_4$, $InCl_3/CdCl_2$, $ZnCl_2$, $InCl_3$, and $CdI_2$.

22. The process as defined by either of claims 1 or 3 wherein said substrate is selected from the group consisting of Ti, chromium plated steel, graphite, conducting glass and mixtures thereof.

23. The process as defined by either of claims 1 or 3 further comprising preheating said substrate prior to applying said layer so as to assure satisfactory adhesion and electrical contact.

24. A photoelectrochemical cell electrode comprising a semiconductor electrode prepared by the process of claim 3.

25. A process for forming a semiconductor except a semiconductor of CdS alone, CdSe alone or mixtures or alloys thereof comprising the steps of:
   (a) preparing a slurry of at least one semiconductor starting material used to form said semiconductor, in powdered form, a flux and a liquid vehicle;
   (b) applying a layer of said slurry to an electrically conductive substrate; and
   (c) annealing said layer to form said semiconductor by treating said layer of step (b) under conditions of temperature and pressure so as to at least partially dissolve at least a portion of one semiconductor material in said flux.

26. The process as defined by claim 25 further comprising incorporating said semiconductor of step (c) in a solid state solar cell.

* * * * *

UNITED STATES PATENT AND TRADEMARK OFFICE
CERTIFICATE OF CORRECTION

PATENT NO.  :  4,368,216
DATED       :  January 11, 1983
INVENTOR(S) :  Joost Manassen et al.

It is certified that error appears in the above-identified patent and that said Letters Patent is hereby corrected as shown below:

Column 7, line 10, "(0.05 ml" should read ---- 0.05 ml ---.

Column 9, line 7, "dride" should read -- dried --.

Signed and Sealed this

Second Day of August 1983

[SEAL]

Attest:

GERALD J. MOSSINGHOFF

*Attesting Officer*     *Commissioner of Patents and Trademarks*